(12) United States Patent
Tucker et al.

(10) Patent No.: US 10,178,786 B2
(45) Date of Patent: Jan. 8, 2019

(54) CIRCUIT PACKAGES INCLUDING MODULES THAT INCLUDE AT LEAST ONE INTEGRATED CIRCUIT

(71) Applicant: Honeywell International Inc., Morristown, NJ (US)

(72) Inventors: James L. Tucker, Clearwater, FL (US); Romney R. Katti, Shorewood, MN (US)

(73) Assignee: Honeywell International Inc., Morris Plains, NJ (US)

( * ) Notice: Subject to any disclaimer, the term of this patent is extended or adjusted under 35 U.S.C. 154(b) by 695 days.

(21) Appl. No.: 14/723,813

(22) Filed: May 28, 2015

(65) Prior Publication Data

US 2016/0330854 A1 Nov. 10, 2016

Related U.S. Application Data

(63) Continuation-in-part of application No. 14/703,734, filed on May 4, 2015, now Pat. No. 9,741,644.

(51) Int. Cl.
*H01L 23/02* (2006.01)
*H05K 7/02* (2006.01)
(Continued)

(52) U.S. Cl.
CPC ......... *H05K 7/026* (2013.01); *H01L 21/4882* (2013.01); *H01L 23/367* (2013.01);
(Continued)

(58) Field of Classification Search
CPC ........ H01L 23/02; H01L 25/105; H01L 23/34
(Continued)

(56) References Cited

U.S. PATENT DOCUMENTS 5,241,450 A 8/1993 Bernhardt et al.
5,579,207 A 11/1996 Hayden et al.
(Continued)

FOREIGN PATENT DOCUMENTS

| EP | 1065752 A1 | 1/2001 |
| JP | 2002373968 A | 12/2002 |
| KR | 1020090093398 A | 9/2009 |

OTHER PUBLICATIONS

"High Density Memory Modules," Interconnect Systems, Inc., retrieved from http://www.isipkg.com/products/modules-and-adapters/high-density-memory-modules on Mar. 13, 2015, 2 pp.
(Continued)

*Primary Examiner* — S. V. Clark
(74) *Attorney, Agent, or Firm* — Shumaker & Sieffert, P.A.

(57) ABSTRACT

A circuit package for electrically connecting a plurality of modules. The circuit package having a first and second mounting plate, each including a plurality of module connectors configured to receive and form electrical connections with the plurality of modules. The circuit package also having a first and second sidewall mounted to the first and second mounting plates. The first sidewall including a plurality of sidewall fins extending outward from the first sidewall so that the plurality of sidewall fins are positioned between the first and second mounting plates and at least partially interleave with the plurality of modules.

20 Claims, 10 Drawing Sheets

(51) Int. Cl.
| | |
|---|---|
| *H05K 5/06* | (2006.01) |
| *H05K 13/00* | (2006.01) |
| *H01L 25/065* | (2006.01) |
| *H01L 25/00* | (2006.01) |
| *H01L 23/40* | (2006.01) |
| *H01L 25/10* | (2006.01) |
| *H01L 23/367* | (2006.01) |
| *H01L 23/373* | (2006.01) |
| *H01L 21/48* | (2006.01) |
| *H01L 23/00* | (2006.01) |

(52) U.S. Cl.
CPC ...... *H01L 23/3731* (2013.01); *H01L 23/3736* (2013.01); *H01L 23/40* (2013.01); *H01L 23/4006* (2013.01); *H01L 25/0652* (2013.01); *H01L 25/0657* (2013.01); *H01L 25/105* (2013.01); *H01L 25/50* (2013.01); *H05K 5/069* (2013.01); *H05K 13/00* (2013.01); *H01L 24/13* (2013.01); *H01L 24/16* (2013.01); *H01L 24/29* (2013.01); *H01L 24/32* (2013.01); *H01L 24/48* (2013.01); *H01L 24/49* (2013.01); *H01L 2224/04042* (2013.01); *H01L 2224/06135* (2013.01); *H01L 2224/131* (2013.01); *H01L 2224/16227* (2013.01); *H01L 2224/291* (2013.01); *H01L 2224/32227* (2013.01); *H01L 2224/48091* (2013.01); *H01L 2224/48145* (2013.01); *H01L 2224/48227* (2013.01); *H01L 2224/49109* (2013.01); *H01L 2224/73207* (2013.01); *H01L 2224/73215* (2013.01); *H01L 2224/73257* (2013.01); *H01L 2224/73265* (2013.01); *H01L 2224/8148* (2013.01); *H01L 2224/81424* (2013.01); *H01L 2224/81439* (2013.01); *H01L 2224/81444* (2013.01); *H01L 2224/81447* (2013.01); *H01L 2224/81484* (2013.01); *H01L 2224/8348* (2013.01); *H01L 2224/83424* (2013.01); *H01L 2224/83439* (2013.01); *H01L 2224/83444* (2013.01); *H01L 2224/83447* (2013.01); *H01L 2224/83484* (2013.01); *H01L 2224/8548* (2013.01); *H01L 2224/85424* (2013.01); *H01L 2224/85439* (2013.01); *H01L 2224/85444* (2013.01); *H01L 2224/85447* (2013.01); *H01L 2224/85484* (2013.01); *H01L 2225/0651* (2013.01); *H01L 2225/06506* (2013.01); *H01L 2225/06537* (2013.01); *H01L 2225/06562* (2013.01); *H01L 2225/06575* (2013.01); *H01L 2225/06589* (2013.01); *H01L 2225/06593* (2013.01); *H01L 2225/107* (2013.01); *H01L 2225/1023* (2013.01); *H01L 2225/1094* (2013.01); *H01L 2924/00014* (2013.01); *H01L 2924/14* (2013.01); *H01L 2924/1434* (2013.01); *H01L 2924/1435* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(58) Field of Classification Search
USPC ........ 257/706, 707, 686, 777; 438/122, 107, 438/110
See application file for complete search history.

(56) References Cited

U.S. PATENT DOCUMENTS

| | | | |
|---|---|---|---|
| 6,218,730 B1 * | 4/2001 | Toy | H01L 23/10 257/704 |
| 6,721,195 B2 | 4/2004 | Brunelle et al. | |
| 7,414,312 B2 | 8/2008 | Nguyen et al. | |
| 7,542,305 B2 | 6/2009 | Petersen et al. | |
| 7,606,042 B2 | 10/2009 | Goodwin | |
| 7,626,259 B2 | 12/2009 | Wehrly, Jr. et al. | |
| 7,796,399 B2 | 9/2010 | Clayton et al. | |
| 7,859,119 B1 | 12/2010 | St. Amand et al. | |
| 7,875,974 B2 | 1/2011 | Gokan et al. | |
| 7,923,846 B2 | 4/2011 | Do et al. | |
| 8,034,713 B2 | 10/2011 | Dunne | |
| 8,084,849 B2 | 12/2011 | Chow et al. | |
| 8,089,795 B2 | 1/2012 | Rajan et al. | |
| 8,115,293 B2 | 2/2012 | Moon et al. | |
| 8,552,546 B2 | 10/2013 | Song et al. | |
| 8,778,734 B2 | 7/2014 | Metsis | |
| 8,779,578 B2 | 7/2014 | Leigh et al. | |
| 8,796,132 B2 | 8/2014 | Sung et al. | |
| 8,834,182 B2 | 9/2014 | Clayton et al. | |
| 8,899,994 B2 | 12/2014 | Clayton et al. | |
| 2005/0230802 A1 | 10/2005 | Vindasius et al. | |
| 2006/0049502 A1 * | 3/2006 | Goodwin | G06F 1/184 257/686 |
| 2007/0126125 A1 | 6/2007 | Rapport et al. | |
| 2007/0287227 A1 | 12/2007 | Huddleston et al. | |
| 2008/0197471 A1 | 8/2008 | Suzuki et al. | |
| 2011/0037157 A1 | 2/2011 | Shin et al. | |
| 2012/0002455 A1 | 1/2012 | Sullivan et al. | |
| 2012/0149151 A1 | 6/2012 | Tane et al. | |
| 2012/0313647 A1 | 12/2012 | Carpenter et al. | |
| 2013/0058148 A1 | 3/2013 | Cantle et al. | |
| 2013/0221500 A1 | 8/2013 | Zhao et al. | |
| 2014/0185226 A1 | 7/2014 | Lam et al. | |

OTHER PUBLICATIONS

"DDR3 DIMM Sockets," Molex, retrieved from http://www.molex.com/molex/products/family?channel=products&chanName=family&key=ddr3_dimm on Mar. 13, 2015, 5 pp.
Wang, "A Talk on Memory Buffers, Including random thoughts from David," Inphi, Jun. 14, 2014, 38 pp.
Salerno, "Multi-Chip Modules & Stacked Die Assemblies," Palomar Technologies Blog, Apr. 30, 2013, 14 pp.
"Multi-Chip Module Technology (MCM)," International Sensor Systems Inc., retrieved from http://www.internationalsensor.com/manufacturing/mcm on Feb. 23, 2015, 5 pp.
"Multi-Chip Packages (MCPs) / System in a Package," Microsemi, retrieved from http://www.microsemi.com/products/memory/multi-chip-packages-mcps?gclid=COHLp7nX-MMCFVFgfgodYb0AvAon Feb. 23, 2015, 2 pp.

* cited by examiner

CIRCUIT PACKAGES INCLUDING MODULES THAT INCLUDE AT LEAST ONE INTEGRATED CIRCUIT

RELATED APPLICATIONS

This application is a continuation-in-part of application Ser. No. 14/703,734, filed on May 4, 2015 entitled "Stacking Arrangement For Integration Of Multiple Integrated Circuits."

TECHNICAL FIELD

This disclosure relates to a circuit packaging system for multiple modules that include at least one integrated circuit within each module.

BACKGROUND

Three-dimensional integrated circuits are employed in applications in which space is an important design factor. As the demand for more functionality in less volume increases, so does the demand for three-dimensional packaging. In addition to the benefit of reducing space, these designs may also realize higher speeds because interconnects between circuit components may be shorter. In some applications, an integrated circuit can be enclosed in a package. The package can provide electrical connections between the integrated circuit and a component on which the package is mounted, e.g., a printed board. The package also may protect the integrated circuit, e.g., from the external environment.

SUMMARY

In some examples, the disclosure describes a circuit package including a first mounting plate defining a first mounting plate major surface including a first plurality of module connectors on the first mounting plate major surface. The circuit package including a second mounting plate defining a second mounting plate major surface including a second plurality of module connectors on the second mounting plate major surface, where the first mounting plate major surface is substantially parallel to and facing the second mounting plate major surface, and where a first module connector of the first plurality of module connectors and a second module connector of the second plurality of module connectors are configured to receive and form an electrical connection with a module including a plurality of integrated circuits. The circuit package including a first sidewall defining a first sidewall major surface and comprising a plurality of sidewall fins extending outward from the first sidewall major surface, where the first sidewall is mounted to the first mounting plate and the second mounting plate so that the plurality of sidewall fins are positioned between the first mounting plate major surface and the second mounting plate major surface, and where the first module connector and the second module connector are located between a first sidewall fin of the plurality of sidewall fins and a second sidewall fin of the plurality of sidewall fins. And the circuit package including a second sidewall defining a second sidewall major surface mounted to the first mounting plate and the second mounting plate so the second sidewall major surface major is substantially parallel to and facing the first sidewall major.

In another example, the disclosure describes a circuit package including a first mounting plate defining a first mounting plate major surface including a first plurality of module connectors on the first mounting plate major surface. The circuit package including a second mounting plate defining a second mounting plate major surface comprising a second plurality of module connectors on the second mounting plate major surface, where the first mounting plate major surface is substantially parallel to and facing the second mounting plate major surface. The circuit package including a plurality of modules, where each respective module of the plurality of modules includes a respective module substrate having a first side installed in a respective first module connector of the first plurality of module connectors and a second side installed in a respective second module connector of the second plurality of module connectors. The circuit package including a first sidewall defining a first sidewall major surface and including a plurality of sidewall fins extending outward from the first sidewall major surface, where the first sidewall is mounted to the first mounting plate and the second mounting plate so that the plurality of sidewall fins are positioned between the first mounting plate major surface and the second mounting plate major surface, and where the first module connector and the second module connector are located between a first sidewall fin of the plurality of sidewall fins and a second sidewall fin of the plurality of sidewall fins. And the circuit package including a second sidewall defining a second sidewall major surface mounted to the first mounting plate and the second mounting plate so the second sidewall major surface major is substantially parallel to and facing the first sidewall major.

In another example, the disclosure describes method for assembling a circuit package including electrically connecting a plurality of modules to respective module connectors attached to a first mounting plate and respective module connectors attached to a second mounting plate to form a module stack, and mounting a first sidewall comprising a plurality of side wall fins to the module stack, where respective sidewall fins of the plurality of sidewall fins at least partially interleave with respective modules of the plurality of modules.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure generally describes a circuit package for housing multiple modules, each module including at least one integrated circuit (IC) die. The modules within the circuit packages of this disclosure may be configured to perform certain functions such as processing (e.g., co-processor or microprocessor dies), memory (e.g., random access memory (RAM) or non-volatile memory (NVM)), power conditioning, ambient monitoring (e.g., temperature and/or health monitoring), sensing, encryption, optics-photonics, or the like. The circuit package may provide at least one of structural support, environmental protection, electromagnetic shielding, heat dissipation, or convenient access for the module contained therein.

In some instances, it may be desirable to increase the number of modules contained within a circuit package, for example, to create memory packages of multiple memory dies in a relatively small space to increase the data storage capacity. In such packages, the physical space between adjacent modules may be reduced in order to obtain greater space efficiency. Close proximity between modules, however, can create increase the heat density within the circuit package, which may lead to overheating, potential failure, or other unintended consequences to the modules contained therein. In some examples, the circuit packages described herein may include a plurality of sidewall fins that form an interleaving stacked relationship with installed the modules. The plurality of sidewall fins may improve the overall rigidity of the circuit package as well as provide an avenue for dissipating heat created within the circuit package.

In some examples, the modules may include stacked IC dies attached to a printed board (PB). The PB may improve the robustness of the modules; however, such modules may be heavier and larger in size requiring additional space within the circuit package and devices containing the circuit package than circuit packages including other substrates. In some examples, the including stacked IC dies may be attached to a ceramic-based or an organic-based module substrate, which may be smaller and lighter compared to a PB. However, such modules that include a ceramic-based or an organic-based module substrate may be more fragile and more prone to mechanical failure than PB substrates. The circuit packages described herein may provide a more rigid package assembly for stacking various modules, including modules including ceramic-based or organic-based substrates. The described circuit packages may also allow for easy disassembly of the circuit package to facilitate removal and replacement of potentially faulty or damaged modules.

Figure 1:
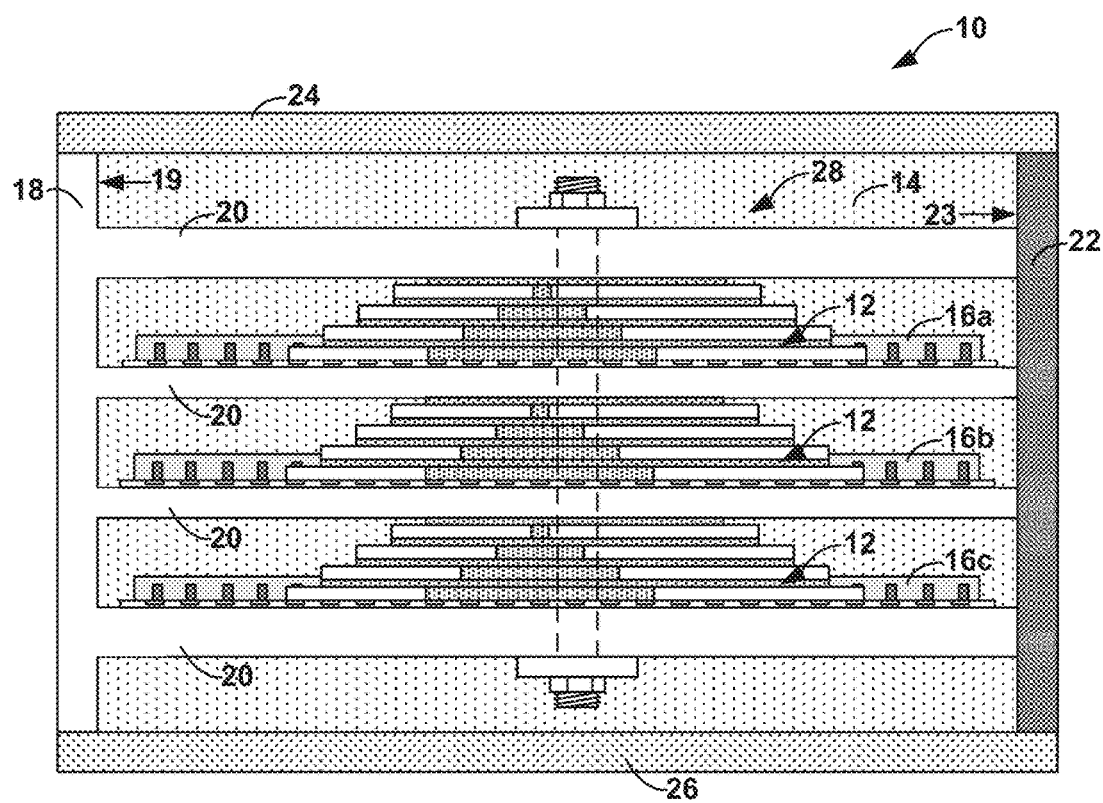
FIG. 1 is a conceptual and schematic diagram illustrating a side view of an example circuit package.

FIG. 1 is a conceptual and schematic diagram illustrating a side view of an example circuit package 10. Circuit package 10 includes a plurality of modules 12, each module attached to a first mounting plate 14 by a respective module connector of first plurality of module connectors 16a, 16b, and 16c (collectively, "module connectors 16"). Circuit package 10 also includes a first sidewall 18 including a plurality of sidewall fins 20, a second sidewall 22, an optional package lid 24, and an optional package base 26. While the fully assembled circuit package 10 may also include a second mounting plate including a second plurality of module connectors, the second mounting plate is not illustrated in FIG. 1 for purposes of clarity. It is intended by the disclosure that general descriptions regarding first mounting plate 14 may apply equally to the second mounting plate. Together, first mounting plate 14, the second mounting plate, first sidewall 18, and second sidewall 22, optional package lid 24, and optional package base 26 may define an inner cavity in which plurality of modules 12 are disposed. In some examples, first mounting plate 14, the second mounting plate, first sidewall 18, and second sidewall 22, optional package lid 24, and optional package base 26 substantially fully enclose the inner cavity.

Circuit package 10 includes first mounting plate 14, which may be substantially planar in shape (e.g., planar or nearly planar) defining a first mounting plate major surface 28. When assembled, first mounting plate major surface 28 faces the internal cavity of circuit package 10 and may contact first sidewall 18 and second sidewall 22 with plurality of sidewall fins 20 disposed within the inner cavity of circuit package 10.

First mounting plate 14 may be formed with any properties or materials suitable for the particular application for which circuit package 10 is intended. For example, first mounting plate 14 may include electrical interconnects for connecting respective modules of plurality of modules 12 or connecting one or module of plurality of modules 12 to external electronic devices. In some examples, first mounting plate 14 may be or include a semiconductor device, may be or include a printed board (PB), or may be or include electrical interconnects for electrically connecting module connectors 16 and plurality of modules 12 to external electronic devices.

As another example, first mounting plate 14 may include a sufficiently rigid material to provide physical support for plurality of modules 12 contained or enclosed in circuit package 10. For example, first mounting plate 14 may include at least one layer including a metal or alloy, such as aluminum, aluminum alloy, alumina, aluminum nitride (AlN), silicon carbide (SiC), or beryllium oxide (BeO); at least one layer including a composite, such as a composite including a fiber-type material, such as a fiber-reinforced plastic (e.g., carbon fiber reinforced plastic), or the like to provide additional rigidity.

In some examples, first mounting plate 14 may be formed of materials with particular thermal properties such that first mounting plate 14 aids to dissipate heat generated by operation of plurality of modules 12. For example, a metal or alloy, or certain composite materials (e.g., a carbon fiber shell including thermally conductive paths or fill in the interior) may provide a thermal pathway to dissipate heat generated by operation of plurality of modules 12. In some examples, the materials used to form first mounting plate 14 may additionally or alternatively help protect the contents of circuit package 10 from external environmental factors such as moisture and dust, or may be configured to help shield plurality of modules 12 from electromagnetic interference (e.g., radio frequency interference).

First mounting plate 14 may also include module connecters 16 attached to first mounting plate major surface 28. Each of the module connectors 16 may be configured to receive and electrically communicate with electrical connections of a respective module of the plurality of modules 12. In first examples, module connectors 16 may be configured to receive and electrically communicate with modules that include a ceramic-based module substrate rather than a printed board substrate.

Module connecters 16 may be mechanically and electrically coupled to first mounting plate major surface 28 by any means including, for example, thermal compression bonding (e.g., copper-to-copper thermal compression bonding or oxide bonding), an adhesive such as an SU-8 adhesive, a benzocyclobutene (BCB) adhesive, or another adhesive that utilizes free-radical, non-condensation-based organic reactions (e.g., an adhesive that does not include ions, water, alcohols, or corrosives), wafer bonding, chemical bonding, physical/mechanical bonding such using screws, bolts, rivets, or pins, or the like.

As described above, in some examples, first mounting plate 14 may include a plurality of interconnect elements including, for example, conductive traces, bond pads, passive circuit elements (e.g., passive resistors, inductors, and capacitors), active circuit elements, or other conductive elements positioned on or within first mounting plate 14. The plurality of interconnect elements (e.g., conductive trace 146 or external bond pad 148 of FIG. 7) may be defined by any suitable electrically conductive material which facilitates electrical communication, such as tungsten, molybdenum, copper, aluminum, silver, gold, or the like. Additionally, the plurality of interconnects may be formed using any suitable technique including, for example, chemical or mechanical etching followed by metal deposition or the like.

In some examples, the plurality of interconnect elements of first mounting plate 14 may be configured to transmit electrical signals between components within circuit package 10 or between components within circuit package 10 and devices externally connected to circuit package 10. Such connections include, for example, electrical connections between one or more modules 12 using module connectors 16, of between one or more modules 12 and external connections (e.g., external bond pad 148 of FIG. 7).

Circuit package 10 may also include first sidewall 18 and second sidewall 22. First and second sidewalls 18 and 22 may be substantially planar in shape (e.g., planar or nearly planar), defining a first sidewall major surface 19 and a second sidewall major surface 23, respectively. In some examples, when circuit package 10 is fully assembled, first sidewall 18 mounts to first mounting plate 14 and the second mounting plate (not illustrated in FIG. 1) such that first sidewall major surface 18 is substantially orthogonal (e.g., orthogonal or nearly orthogonal) to both first mounting plate major surface 28 and the major surface of the second mounting plate. In a similar manner, second sidewall 22 may mourn to first mounting plate 14 and the second mounting plate such that second sidewall major surface 23 is substantially orthogonal to both first mounting plate major surface 28 and the major surface of the second mounting plate with first and second sidewall major surfaces 19 and 23 facing one another. While FIG. 1 illustrates a box (e.g., cube, rectangular polygonal, or the like) configuration for circuit package 10, other types of circuit packages are also envisioned by this disclosure including, for example, a clamshell type circuit package.

Figure 8:
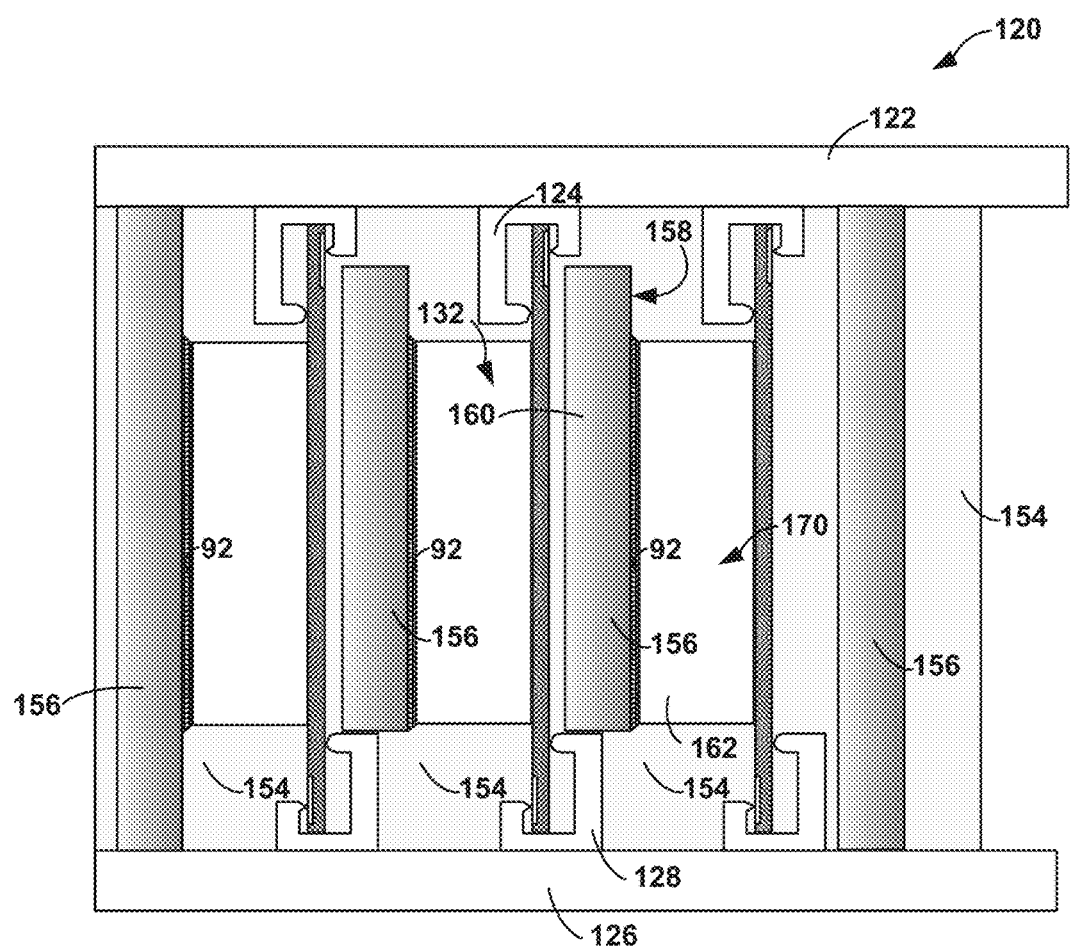
FIG. 8 is a conceptual and schematic diagram illustrating a side view of example module stack for a circuit package.

In some examples, first and second sidewalls 18 and 22 may be removably mounted to first mounting plate 14 and the second mounting plate (e.g. second mounting plate 126 of FIG. 8). The removable relationship may be established using, for example, temporary adhesive, retaining clips, snaps, pins, screws, bolts, or the like. In some examples, one or both of first and second sidewalk 18 and 22 may be fixably mounted to one of first mounting plate 14 or second mounting plate. For example, first and second sidewalk 18 and 22 may be fixably mounted to first mounting plate 14 using, for example, an epoxy, rivets, security fasteners, or the like so first and second sidewalls 18 and 22 are not easily separated from first mounting plate 14. In another example, first sidewall 18 may be fixably mounted to first mounting plate 14 and second sidewall 22 may be fixably mounted to the second mounting plate. In such examples, circuit package 10 may still be partially dissembled to access and remove/replace one or more of plurality of modules 12.

In some examples, the junction between first mounting plate 14 and first and second sidewalls 18 and 22 may form a tight seal that reduces the intrusion of moisture, dust, or other environmental factors from being introduced into the internal cavity of circuit package 10. In some examples the junction between the first mounting plate 14 and first and second sidewalk 18 and 22 may be reinforced using for example welding, sealant, epoxy, solder, or the like.

In some examples, first sidewall 18 may also include plurality of sidewall fins 20 extending from first sidewall major surface 19 so that, when assembled, plurality of sidewall fins 20 extend into the internal cavity of circuit package 10 at least partially forming a interleaving stacked configuration with modules 12. When assembled, each of the sidewall fins of the plurality of sidewall fins 20 may directly contact (e.g., physically contact) or indirectly contact (e.g., contacting via thermal paste 92 of FIG. 5 or a spacer or washer) one or more of plurality of modules 12. In some examples, such contact between the sidewall fins 20 and modules 12 may provide structural support for modules 12 as well as provide a path for distributing heat generated by modules 12. In some examples, the plurality of sidewall fins 20 may help provide rigidity for circuit package 10.

In some examples, each sidewall fin of plurality of sidewall fins 20 may be substantially the same size, thickness, and shape, while in other examples, at least one of plurality of sidewall fins 20 may be different in size, thickness, and/or shape than at least one other of plurality of sidewall fins 20. In some examples, plurality of sidewall fins 20 may be substantially planar in shape as shown in FIG. 1. In other examples plurality of sidewall fins 20 may be tapered, e.g., wedge-shaped, so that the thickness of each fin decreases as the fin extends further away from the sidewall (e.g., sidewall fins 96 of FIG. 5 described below).

First sidewall 18, plurality of sidewall fins 20, and the second sidewall (including any optional sidewall fins attached to or integral with the second sidewall) may be formed with any properties or materials suitable for the particular application for which circuit package 10 is intended. For example, first sidewall 18 and plurality of sidewall fins 20 may be formed of thermally conductive material(s) with particular thermal properties such that sidewall 18 helps dissipate heat generated within circuit package 10 during operation, e.g., heat generated by plurality of modules 12. In such examples, heat generated by plurality of modules 12 in assembled circuit package 10 may be transferred directly from the modules 12 to one or more of the plurality of sidewall fins 20. Plurality of sidewall fins 20 may then in turn transfer the heat to the exterior of circuit package 10, e.g., toward first sidewall 18. First sidewall 18 may be subjected to air-cooling or temperature controlled using other means including, for example, using a heat sink, applying liquid cooling, or the like. Thermally conductive materials that may be useful for dissipating heat include, for example, aluminum, anodized aluminum, brass, copper, silver, gold, alloys including alloys of nickel, iron, aluminum, cobalt, composite materials (e.g., a carbon fiber shell including thermally conductive paths or fill in the interior), or the like. In some examples the thermally conductive materials may have a thermal conductivity about 10 to about 100 watts per meter kelvin (W/(m·K)) or greater. In some examples, first sidewall 18 may include an electrically non-conductive material including, for example, alumina, aluminum nitride (AlN), silicon carbide (SiC), beryllium oxide (BeO), or the like.

When fully assembled, circuit package 10 may also include plurality of modules 12, optional package lid 24, and optional package base 26. Package lid 24 and package base 26 may be mechanically attached to circuit package 10 using, for example, mounting clips, bolts, rivets, a temporary or permanent adhesive, or the like and provide added protection from the environmental external to circuit package 10 for the enclosed modules 12. In some examples, package lid 24 and package base 26 may include materials similar to or substantially the same as those described above with respect to first sidewall 14 and plurality of sidewall fins 20.

In some examples, package lid 24 and package base 26 may also include an electrically non-conductive material including, for example, alumina, aluminum nitride (AlN), silicon carbide (SiC), beryllium oxide (BeO), or the like. The use of such electrically non-conductive materials may be used to form a hermetically or near-hermetically sealed circuit package 10 in some examples.

In some examples package lid 24 and base 26 may be attached to circuit package 10 using a sealing material deposited along the contact surfaces between the package lid 24/base 26 and the remainder of circuit package 10. The sealing material used to create a hermetically sealed circuit package 10 may include, for example, gold-tin (AuSn), gold-germanium (AuGe), tin-lead (SnPb), metal filled glasses, or lead free solder (e.g., tin-silver-copper alloys). In other examples, the materials from which package lid 24, package base 26, and/or sealing material such as a polymeric adhesive are formed may be selected to form a near-hermetically sealed circuit package 10.

While FIG. 1 illustrates the inclusion of package lid 24 and package base 26, in some examples the function of package lid 24 and package base 26 may be provided by one or more of the sidewall fins 20 of circuit package 10, allowing for the omission of the package lid 24 and package base 26 from circuit package 10.

Circuit package 10 also includes modules 12, each module physically and electrically connected to a respective module connector of module connectors 16. While only three modules 12 are depicted in FIG. 1, it is envisioned that circuit package 10 may include any number of modules 12; generally, circuit package 10 may include a plurality of modules 12. In some examples, modules 12 installed in circuit package 10 may be configured for various signal processing tasks, which may be specific to the application for which modules 12 are used. For example, modules 12 may be configured for specific tasks such as processing (e.g., co-processor or microprocessor die), memory (e.g., random access memory (RAM) or non-volatile memory (NVM)), power conditioning, ambient monitoring (e.g., temperature and/or health monitoring), sensing, encryption, optics-photonics, or the like. Each of modules 12 may be configured for the same task in some examples. In other examples, at least one module of modules 12 may be configured for a differ task than at least one other module of modules 12.

Figure 2A:
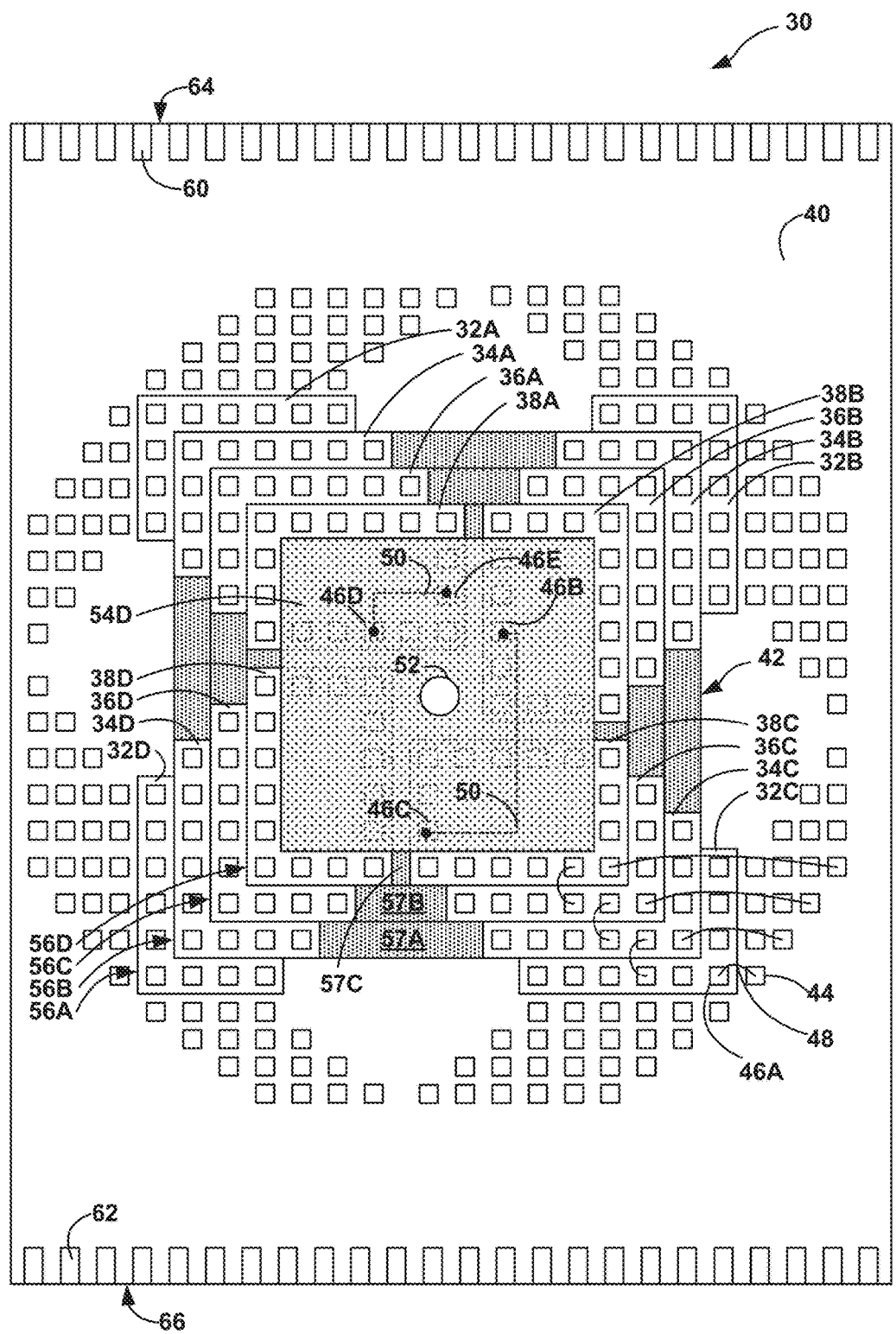
FIG. 2A is a conceptual and schematic diagram illustrating a lop view of example module that may be incorporated in a circuit package.
Figure 2B:
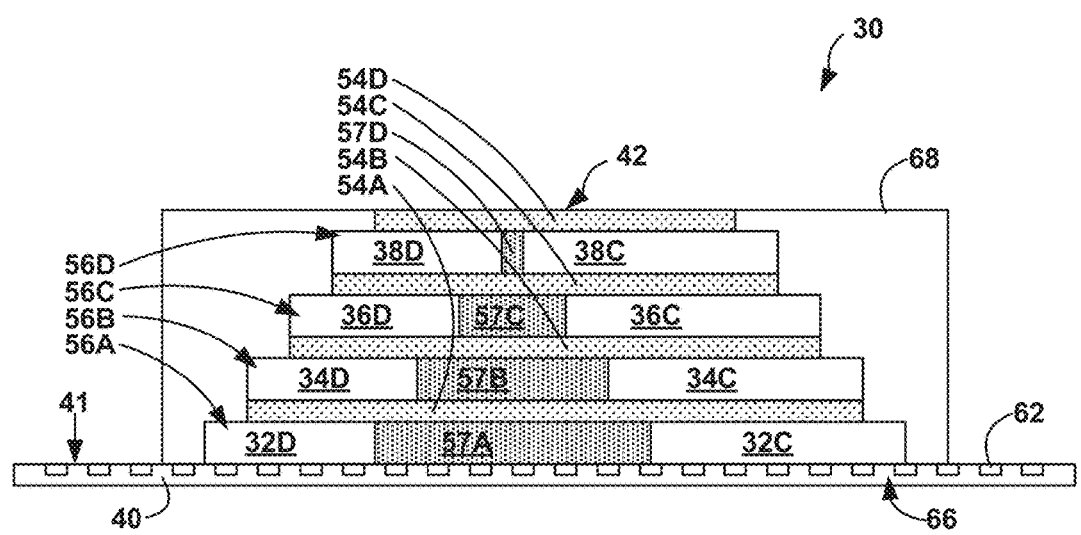
FIG. 2B is a conceptual and schematic diagram illustrating a side view of an example module that may be incorporated in a circuit package.

Modules 12 may be custom designed or may be purchased from a third party. By way of example, FIGS. 2A and 2B show a conceptual and schematic top (FIG. 2A) and side (FIG. 2B) views of an example module 30 that may be incorporated in circuit package 10. Module 30 includes a module substrate 40 having a module substrate major surface 41, a contour support 42 including a plurality of support frames 57A-57D (collectively, "support frames 57") and a plurality of support plates 54A-54D (collectively, "support plates 54") arranged to create multiple tiers 56A-56D (collectively, "tiers 56"). Each tier of tiers 56 includes a respective support frame of support frames 57 and a respective plurality of IC dies. For example, module 30 includes a first tier 56A that includes a first support frame 57A and a first plurality of IC dies 32A-32D, a second tier 56B that includes a second support frame 57B and a second plurality of IC dies 34A-34D, a third tier 56C that includes a third support frame 57C and a third plurality of IC dies 36A-36D, and a fourth tier 56D that includes a fourth support frame 57D and a fourth plurality of IC dies 38A-38D.

Module substrate 40 may include a plurality of interconnect elements. Interconnect elements of module substrate 40 may include, for example, module substrate bond pads 44, module connector pads 60 and 62, vias, traces, passive circuit elements (e.g., passive resistors, inductors, and capacitors), active circuit elements, metal layers, or other conductive elements positioned on or within module substrate 40. The plurality of interconnect elements may be defined by any suitable electrically conductive material which facilitates electrical communication, such as tungsten, molybdenum, copper, aluminum, silver, gold, or the like. The plurality of interconnect elements of module substrate 40 may be configured to transmit electrical signals throughout module 30. For example, module substrate 40 may include a first plurality of module connector pads 60 along a first edge 64 of module substrate 40 and a second plurality of module connector pads 62 along a second edge 66 of module substrate 40. Plurality of interconnect elements of module substrate 40 may transmit electrical signals between IC dies 32-38 and corresponding first and second module connector pads 60 and 62. In another example the plurality of interconnect elements of module substrate 40 may be configured to transmit electrical signals between IC dies 32-38, and between IC dies 32-38 and other components of the module 30.

In some examples, first and second edges 64 and 66 of module substrate 40 may be directly opposite of one another so that when module 30 is mounted in circuit package 10, the first and second plurality of module connector pads 60 and 62 establish electrical connections with corresponding first and second mounting plates respectively. Such configurations are described in more detail below.

Module substrate 40, including any interconnect elements, may be formed using any suitable materials and any suitable techniques. For example, module substrate 40 may be formed using any suitable semiconductor processing technique in which interconnect elements are formed as part of the back end-of-line (BEOL) processing part of a semiconductor fabrication step. Additionally, in examples in which module substrate 40 includes semiconductor components such as transistors, the semiconductor components may be formed using semiconductor processing techniques (e.g., as part of front-end-of-line (FEOL) processing). In some examples, module substrate 40 may be a PB, a semiconductor device, a ceramic-based material, or an organic-based material including electrical interconnects for electrically interconnecting IC dies 34A-34D, 36A-36D, and 38A-38D (collectively "IC dies 32-38") to module connector pads 60 and 62. In some examples, module substrate 40 may itself be an integrated circuit formed of one or more semiconductor materials including, for example, bulk silicon, silicon-on-insulator (SOI), complementary metal oxide semiconductor (CMOS), or the like.

Module 30 also includes IC dies 32-38, which may, in some examples, be configured for various signal processing tasks or applications. For example, IC dies 32-38 may include one or more die configured for one or more of processing (e.g., co-processor or microprocessor die), memory (e.g., random access memory (RAM) or non-volatile memory (NVM)), power conditioning, ambient monitoring (e.g., temperature and/or health monitoring), sensing, encryption, optics-photonics, or the like. In some examples, IC dies within a respective tier of tiers 56 may be configured to perform similar functions including, for example, memory storage, processing, or the like. In other examples, IC dies with a respective tier of tiers 56 may be configured to perform different functions. Similarly, in some examples, each tier of tiers 56 may include IC dies configured to perform similar functions, such that all IC dies 32-38 in module 30 perform the same function, or at least one tier of tiers 56 may include IC dies configured to perform different functions that at least one other tier of tiers 56.

In some examples, tiers 56 may be in the shape of a plane and aligned substantially parallel to the surface of module substrate 40. Tiers 56 may be stacked, in some examples, in a square-pyramidal configuration with each successive tier farther away from module substrate 40 and sequentially smaller in lateral extent than the previous tier. In some such examples, a corresponding stack of IC dies (e.g., dies 32C, 34C, 36C, and 38C (collectively IC dies 32C-38C)) may be stacked and arranged so adjacent dies (e.g., dies 32C and 34C) are laterally offset in at least one direction (e.g., two directions as shown in FIG. 2A) with each successively stacked die farther away from module substrate 40 and closer toward the center of contour support 42 defined by an optional mounting aperture 52. The stacking arrangement may be repeated for each set of corresponding stacked IC dies (e.g., IC dies 32A-38A, IC dies 32B-38B, and IC dies 32D-38D) creating a high density packing of IC dies, which may be useful in a variety of applications.

In the example shown in FIGS. 2A and 2B, each tier 56 includes four IC dies (e.g., first plurality of IC dies 32A-32D) and a portion of contour support 42 (e.g., support frame 57A). Each support frame 57 includes a plurality of lateral contact surfaces aligned substantially orthogonal (e.g., orthogonal or nearly orthogonal) to module substrate major surface 71. The lateral contact surfaces may be configured to physically pair with a corresponding IC dies of the first plurality of IC dies 32A-32D so that at least two sides of each IC die 32A-32D abut at least two lateral contact surfaces.

In some examples, contour support 42 includes a plurality of support plates 54 that are substantially planar in shape and extend laterally outward from the center portion of contour support 42 defined by mounting aperture 52. Support plates 54 may be positioned substantially parallel to one another and configured in a staggered arrangement with corresponding support frames 57 separating adjacent support plates 54. For example, as shown in FIGS. 2A and 2B, module 30 is configured with tier 56A, which includes first support frame 57A and first plurality of IC dies 32, attached to module substrate major surface 41, with support plate 54A attached to the topside of tier 56A; with tier 56B attached to the topside of support plate 54A; with support plate 548 attached to the topside of tier 56B; with tier 56C, attached to the topside of support plate 5413; with support plate 54C attached to the topside of tier 56C; with tier 56D attached to the topside of support plate 54C; and with support plate 54D attached to the topside of tier 56D. While only four tiers 56 are illustrated in FIGS. 2A and 2B, module 30 may include more or fewer tiers 56 depending on the intended application of module 30. Additionally, each tier 56 may include more or fewer IC dies 32, 34, 36, and 38.

In some examples, support plates 54 may partially cover the topside of the corresponding IC tier 56 to which support plate 54 attaches. For example, as shown in FIG. 2A, support plate 54D partially covers tier 56D, leaving two perimeter portions on the respective major surfaces of each IC die of IC dies 38A-38D partially exposed. In some examples, the partially exposed major surfaces of IC dies 32, 34, 36, and 38 may include a plurality of IC bond pads, e.g., IC bond pad 46A of IC die 32C, that may be used to form electrical connections, e.g., using wires 48, between respective IC dies of IC dies 32, 34, 36, and 38 and other components in module 30 or other components in circuit package 10 and may be useful in some cases to connect IC dies 32, 34, 36, and 38, for example, to a common ground, power source, or signal connection In some examples, at least one support plate of support plates 54 may include an electrically conductive trace 50. In some examples, electrical traces 50 may be used to make an electrical connection between a first IC die and a second IC die of IC dies 32, 34, 36, or 38. For example, as shown in FIG. 2A, a respective electrical trace of electrical traces 50 may be used to electrically connect IC dies 38B and 38C (e.g., respective bond pads on IC dies 38B and 38C) to one another. In some such examples, the electrical trace of electrical traces 50 may be attached to corresponding IC bond pads 46B and 46C of IC dies 38B and 38C that are covered by support plate 54D. Additionally or alternatively, electrical traces 50 may be configured to transmit electrical signals between two or more IC bond pads of a single IC die (e.g., IC bond pads 46D and 46E of IC die 38A as shown in FIG. 2A), two or more IC dies of different tiers (e.g., between IC dies 36C and 38C of tiers 56C and 56D respectively using support plate 54C—not illustrated), or the like.

Electrical traces 50 may be formed in support plates 54 using any applicable technique including, for example, forming electrical traces 50 as part of the fabrication of support plates 54. For example, a plurality of metal layers may be deposited onto a dielectric material using planar copper dual damascene interconnect technology; tungsten polished local interconnect technology, or planarized subtractive aluminum interconnect technology; or printed, plate, or the like on a dielectric material; or some combination of these techniques during formation of support plates 54. The traces 50 may be defined by any suitable electrically conductive material which facilitates electrical communication, such as tungsten, molybdenum, copper, aluminum, silver, or gold. The electrical connections between traces 50 and covered bond pads 46 of IC dies 32, 34, 36, and 38 may be establish using any suitable means including, for example, brazing, soldering, or the like.

In some examples, support plates 54 may perform certain function (e.g., electrical interconnection, mechanical support, radiation shielding, magnetic shielding, thermal conductivity, EM shielding, or any other function described herein and may include a similar constructions, aside from dimensional differences used to form the stepped structure.

In some examples, contour support 42 may define mounting aperture 52, which extends substantially through contour support 42 and module substrate 40. Mounting aperture 52 may be aligned so that it extends substantially orthogonally (e.g., orthogonally or nearly orthogonally) to module substrate major surface 41. Mounting aperture 52 may be placed anywhere within contour support 42 so that mounting aperture 52 does not physically interfere with the stacking arrangements of plurality of IC dies 32, 34, 36, and 38. For example, mounting aperture 52 may be formed at the center of contour support 42. In some examples, a component may extend through mounting aperture 52 to provide a thermal pathway for dissipating heat from module 30 to plurality of sidewall fins 20.

In some examples, the module 30 may include optional module cover 68, which attaches to module substrate major surface 41 and covers contour support 42 and IC dies 32-38. In some examples, module cover 68 may form a heretic or near-hermetic seal with module substrate 40, thereby enclosing IC dies 32-38 and protecting them from environmental effects. In some examples, module cover 68 may be formed with a thermal conductivity material or shielding material as discussed above. Module cover 68 may provide added protection for IC dies 32-38 making it easier for a user to install module 30 in circuit package 10 without damaging the module.

Module 30 may be formed using any one of a variety of techniques. In some examples, module 30 may be formed is a sequential fashion on a tier-by-tier basis, assembling each tier of tiers 56 and support plates 54 using for example, an any adhesive available front a variety of suppliers that is compatible with module 30, mechanical attachments including fixturing such as with screws or other mechanical fasteners, bondings including chemical bonding or physical/mechanical bonding, a hybrid the techniques, or the like. In another example, contour support 42 may be fully assembled first followed by the insertion and attachment of IC dies 32-38. Once built, module 30 may be installed in any of the circuit packages decided by this disclosure.

Figure 3:
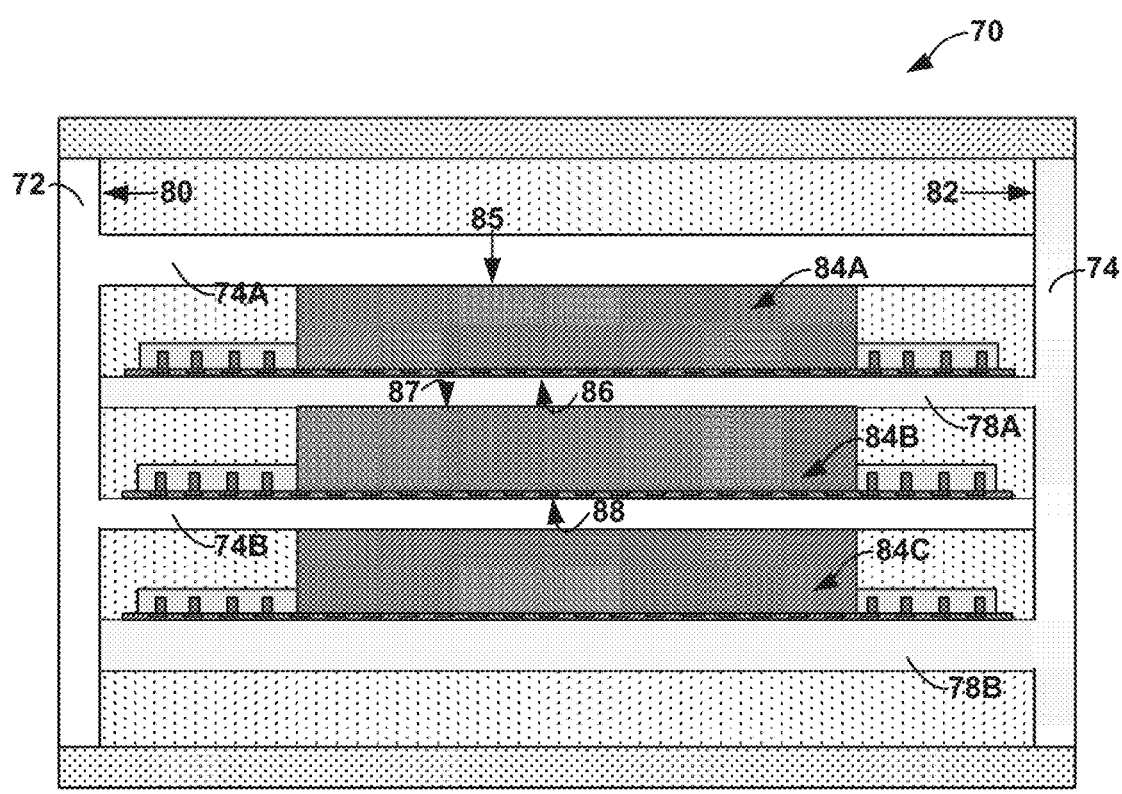
FIG. 3 is a conceptual and schematic diagram illustrating a side view of an example circuit package.

As another example, FIG. 3 shows a conceptual diagram illustrating a side view of a circuit package 70 that includes a first sidewall 72 including a first plurality of sidewall fins 74A and 74B (collectively "first plurality of sidewall fins 74") and a second sidewall 76 including a second plurality of sidewall fins 78A and 78B (collectively "second plurality of sidewall fins 78"). In some examples, first plurality of sidewall fins 74 may be substantially planar in shape, extending outward front first sidewall major surface 80. Similarly, second plurality of sidewall fins 78 also may be substantially planar in shape, extending outward from second sidewall major surface 82.

As shown in FIG. 3, in some examples, first plurality of sidewall fins 74 (including first sidewall fins 74A and 74B) and second plurality of sidewall fins 78 (including second sidewall fins 78A and 78B) may take on an interleaved stacked configuration with modules 84A, 84B, and 84C. For example, as shown, first sidewall fin 74A contacts the top surface 85 of module 84A and second sidewall fin 78A contacts the bottom surface 86 of module 84A. In an alternating fashion, second sidewall fin 78A contacts the top surface 87 of module 84B and additional first sidewall fin 74B contacts the bottom surface 88 of module 84B to create the interleaved structure. In other examples, first plurality of sidewall fins 74 and second plurality of sidewall fins 78 may form other stacked configurations including, for example, a semi-alternating slacking configuration with plurality of modules 84A, 84B, and 84C but not with one another. Such stacked configurations may include a single module, e.g. module 84A, being contained between two sidewall fins of just first plurality of sidewall fins 74, e.g. first sidewall fins 74A and 74B, while other modules, e.g., module 84C are contained between two sidewall fins of just second plurality of sidewall fins 78, e.g. second fins 78A and 78B. In yet other examples, the stacked configuration may use a combination of both or other techniques.

Figure 4A:
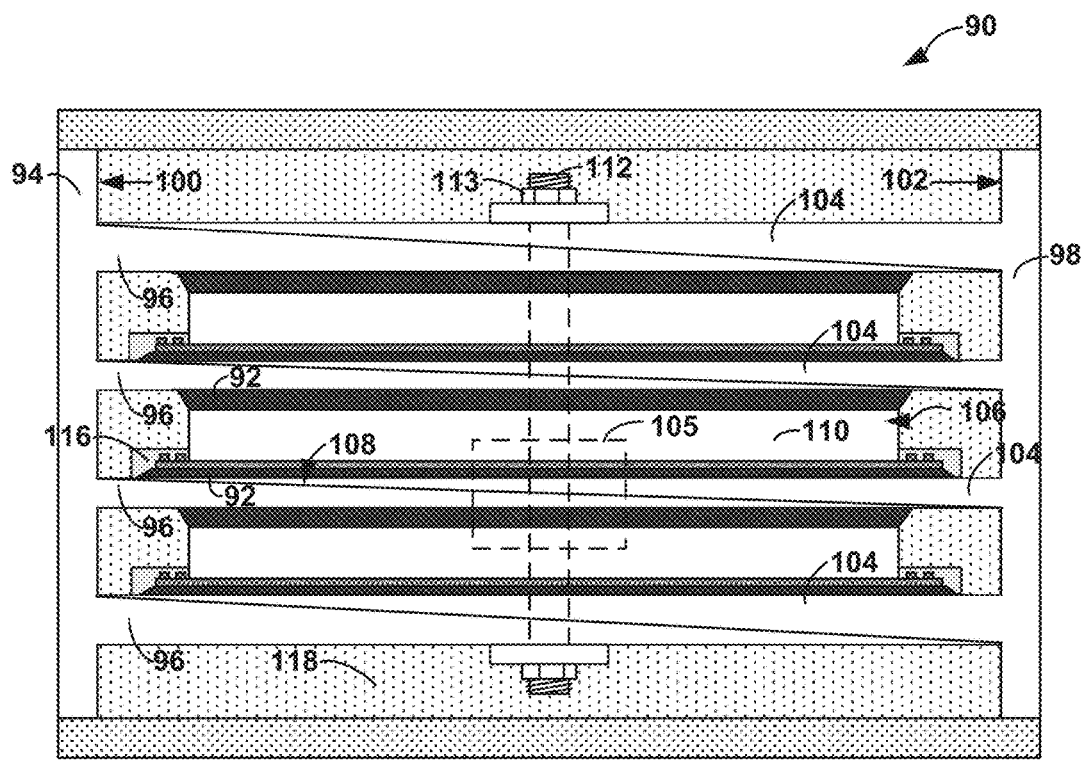
FIG. 4A is a conceptual and schematic diagram illustrating a side view of an example module connector assembly for a circuit package.

In other examples, first plurality of sidewall fins 74 and second plurality of sidewall fins 78 may be configured to contact one another during assembly. For example, FIG. 4A provides an example illustrating a side view of an example module connector assembly for a circuit package 90. Circuit package 90 includes a first sidewall 94 having a first plurality of sidewall fins 96 extending from a first sidewall major surface 100. Circuit package 90 also includes a second sidewall 98 having a second plurality of sidewall fins 104 extending from a second sidewall major surface 102. As shown, each fin of first plurality of sidewall fins 96 and second plurality of sidewall fins 104 are constructed with a taper that decreases the thickness of the respective fin as the distance away from the respective sidewall major surface, e.g. first sidewall major surface 100, increases.

Figure 5:
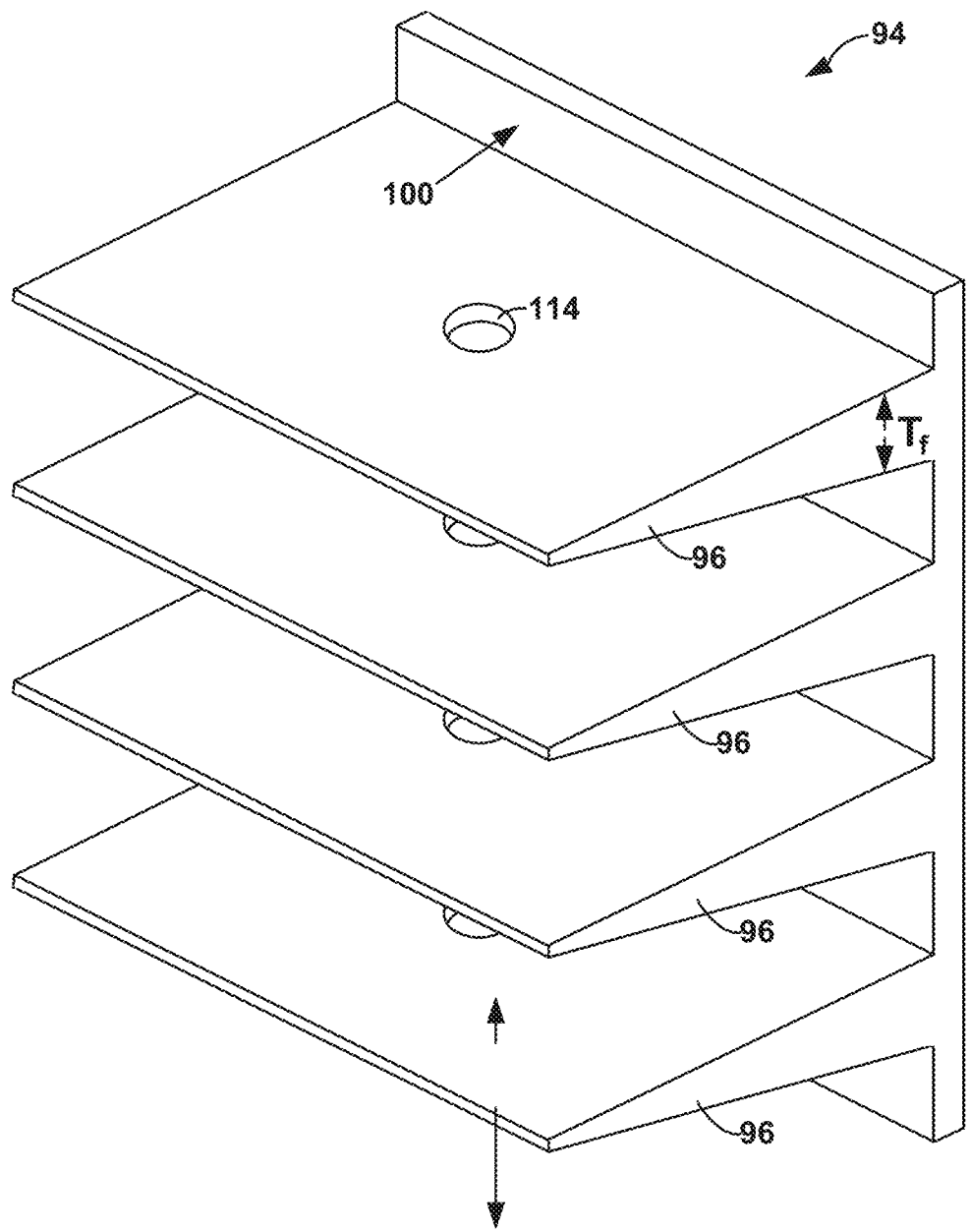
FIG. 5 is a conceptual and schematic perspective view of an example sidewall for a circuit package.

The taper of sidewall fins 96 can be seen in FIG. 5, which provides a conceptual perspective view of example first sidewall 94 from circuit package 90 of FIG. 4A. As shown in FIG. 5, first sidewall 94 includes a first plurality of sidewall fins 96 extending from first sidewall major surface 100. Each sidewall fin of the plurality of sidewall fins 96 includes a taper reducing the thickness $T_f$ of each respective sidewall fin of first plurality of sidewall fins 96 as the distance away from first sidewall major surface 100 increases. In some examples each sidewall fin of first plurality of sidewall fins 96 may define a mounting aperture 114 that extends through the thickness of first plurality of sidewall fins 96. Mounting aperture 114 may be configured to receive a mounting rod 112 (shown in FIG. 4A). In some examples, the mounting rod 112 may receive a nut 113 that can be advanced to exert a compressive force on the modules (e.g., module 106) and first plurality of sidewall fins 96 and second plurality of sidewall fins 104 to provide additional rigidity when circuit package 90 is fully assembled.

Figure 4B:
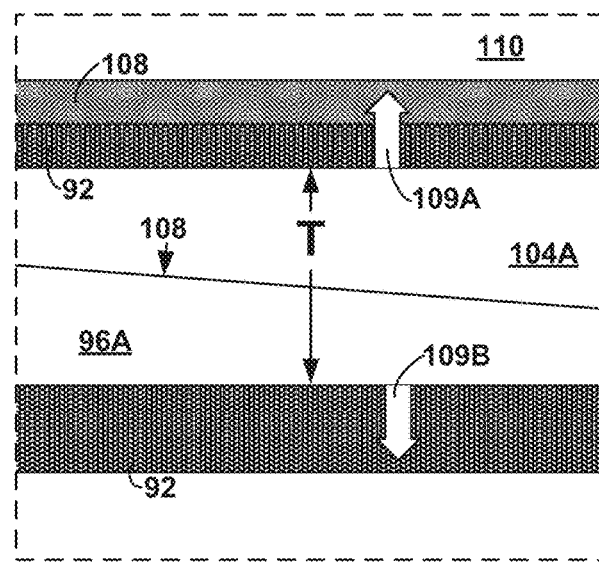
FIG. 4B is an enlargement of a portion of the conceptual and schematic diagram of FIG. 4B.

In some examples, the respective tapers of first plurality of sidewall fins 96 and second plurality of sidewall fins 104 may be configured align with one another when circuit package 90 is assembled. As shown in FIG. 4B, illustrating an expanded view of area 105, in such examples, a representative first fin 96A of first plurality of sidewall fins 96 may either directly contact (e.g., physically contact) or indirectly contact (e.g., contacting one another via a thermal paste) and slidably advance along a representative second fin 104A of second plurality of sidewall fins 104 during assembly. Junction 108 shows the point of contact between first fin 96A and second fin 104A. During assembly, as first sidewall 94 and second sidewall 98 advances into the assembled configuration, the respective tapers of the first fin 96A and second fin 104A slidably advance across one another causing the overall thickness T of the first and second fins 96A and 104A to increase. The increase in the overall thickness T of the first and second fins 96A and 104A introduces compression forces against the modules, e.g. module 106, in directions 109A and 109B. The compression forces against the modules may in turn provide added support for the modules, e.g. module 106, and improve the overall rigidity of circuit package 90.

In some examples, the contacting surfaces, e.g. junction 108, of the corresponding fins of first plurality of sidewall fins 96 and second plurality of sidewall fins 104 (e.g., first fin 96A and second fin 104A) may be coated with a thermal paste, such as those described above, that may enhance the transfer of heat between contacting surfaces of the corresponding fins. In some examples, the internal cavity of circuit package 90 may be back filled with a thermal paste or thermal fluid to aid with heat dissipation.

In some examples, a plurality of modules, e.g., module 106, may be installed within circuit package 90 prior to the inclusion of first sidewall 94 and second sidewall 98. The plurality of modules, e.g., module 106, may physically and electrically connected to circuit package 90 using respective module connectors, e.g. module connector 116, positioned on both the first mounting plate 118 and second mounting plate (not shown). The module connectors, e.g. module connector 116, may be any type of connector or socket assembly configured to receive a module 106 and electrically communicate with the plurality of module connector pads located on the module substrate of the module (e.g., plurality of module connector pads 60 or 62 of FIG. 2A). An example of a module connector assembly is illustrated in FIGS. 6 and 7.

Figure 6:
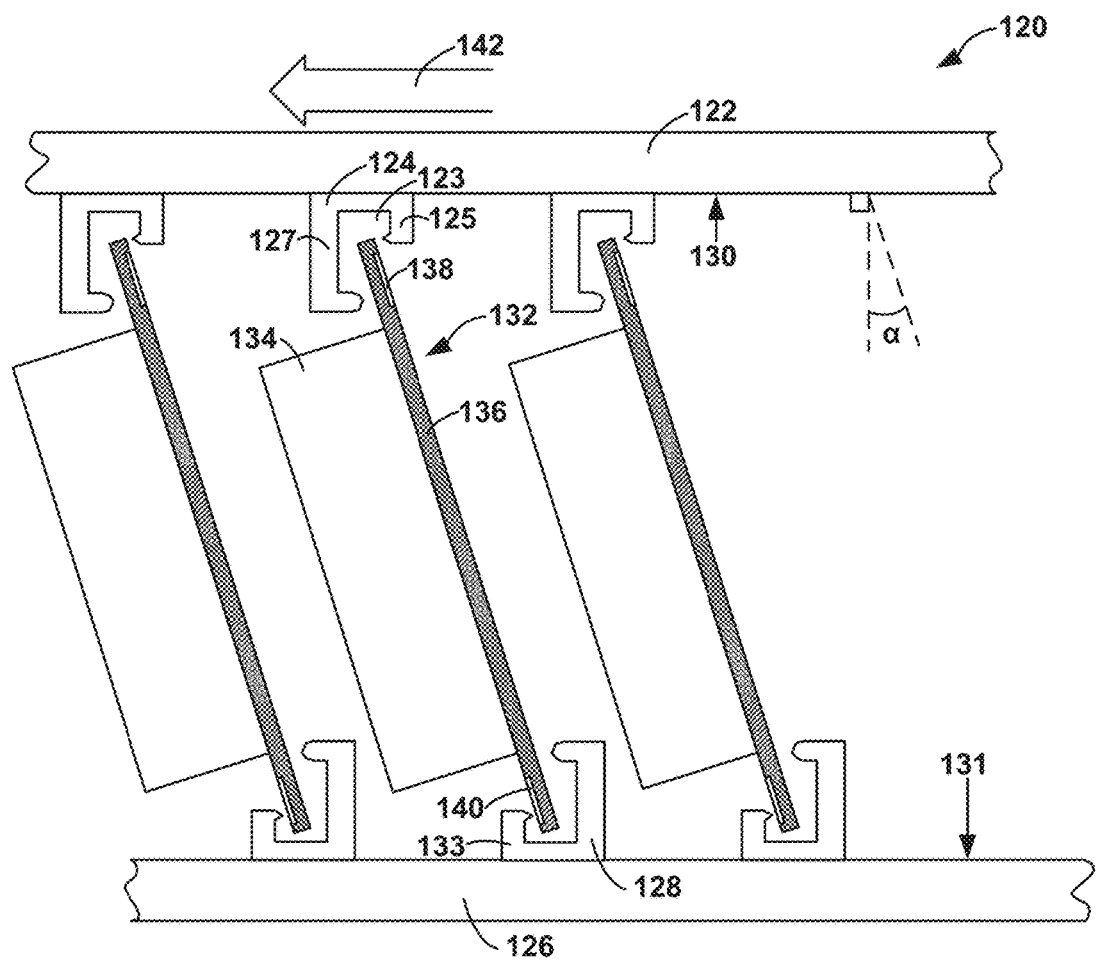
FIG. 6 is a conceptual and schematic diagram illustrating a side view of an example module stack for a circuit package.

FIG. 6 shows a conceptual diagram illustrating a side view of an example module stack 120 for a circuit package. Module stack 120 includes first mounting plate 122, second mounting plate 126, and plurality of modules 132 (only one module identified in FIG. 6). First mounting plate 122 includes a first plurality of module connectors 124 (only one module connector identified in FIG. 6) aligned and attached to first mounting plate major surface 130. Each module connector of the first plurality of module connectors 124 may include an internal space 123 configured to receive a respective module substrate 136 of the plurality of modules 132, such that the plurality of modules 132 may be inserted into first plurality of module connectors 124 at an angle α to first mounting plate major surface 130. In some examples, first plurality of module connectors 124 may have a "G-shaped" or hooked configuration including a first arm 125 and second arm 127 configured to contact and retain opposite sides of a respective module substrate 136 of a module from plurality of modules 132. In some examples, the first arm 125 and second arm 127 may extend to different lengths from first mounting plate major surface 130 such that the two arms 125 and 127 contact the module substrate 136 on opposite sides and at different linear positions along module substrate 136 as measured from first mounting plate major surface 130.

In a similar manner, second mounting plate 126 includes a second plurality of module connectors 128 aligned and attached to second mounting plate major surface 131. Each of the module connectors of the second plurality of module connectors 128 are aligned to coordinate with a respective module connector of the first plurality of module connectors 124 to receive a module from plurality of modules 132. As shown in FIG. 6, when first mounting plate 122 is moved in the direction of arrow 142 relative to second mounting plate 126, first and second mounting plates 122 and 126 are positioned in an un-locked configuration for receiving plurality of modules 132. In the un-locked configuration, each module of the plurality of modules 132 may be inserted at angle α between a first module connector of first plurality of module connectors 124 and a corresponding second module connector of second plurality of module connectors 128.

Figure 7:
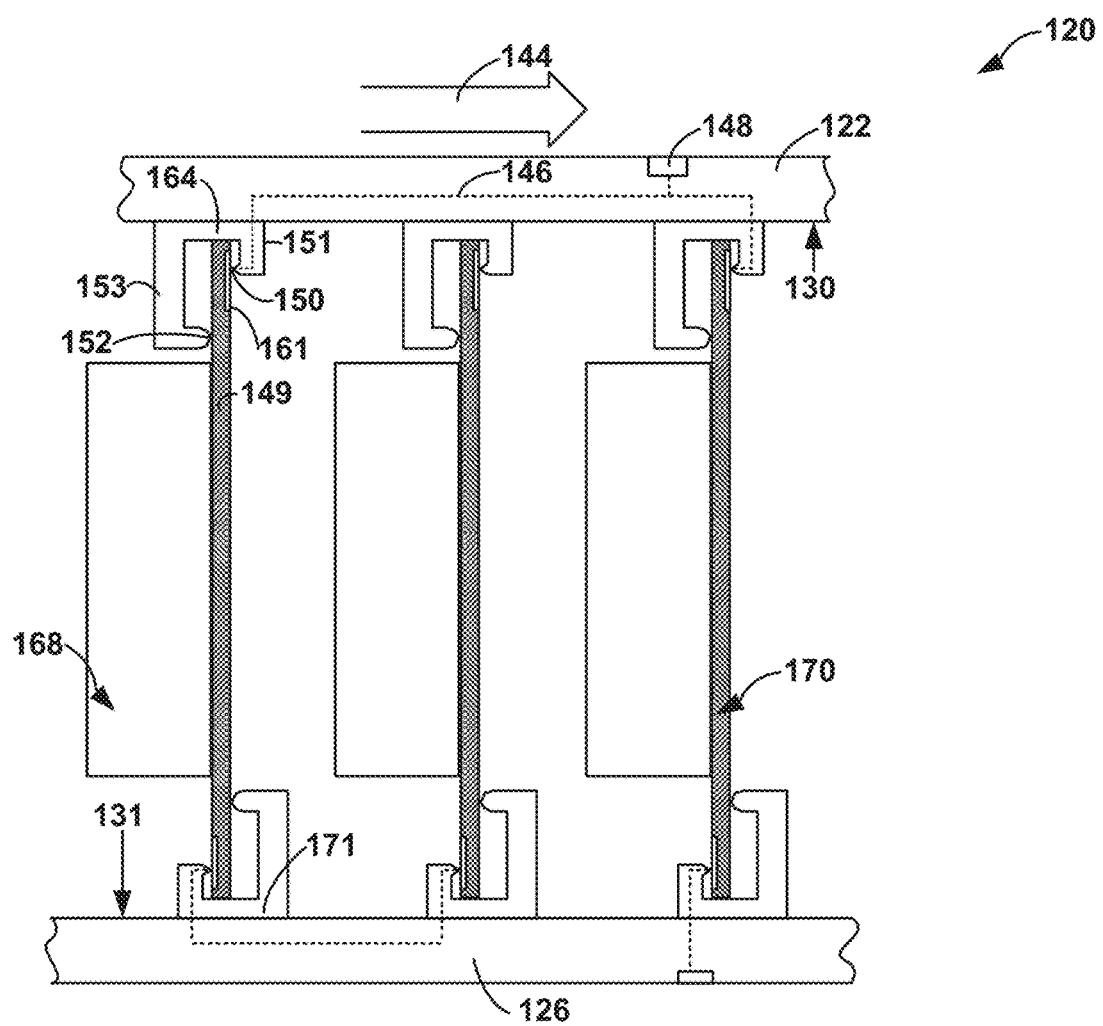
FIG. 7 is a conceptual and schematic diagram illustrating a side view of example module stack for a circuit package.

Once all modules 132 are inserted into module stack 120, first mounting plate 122 may be advanced in direction 144 of FIG. 7, relative to second mounting plate 126 to obtain a locked configuration such that the module substrates, e.g. module substrate 149, front each of plurality of modules 132 may align substantially orthogonal, e.g., orthogonal or nearly orthogonal, to both first mounting plate major surface 130 and second mounting plate major surface 131. In the locked configuration, each module connector, e.g., first module connector 164 and second module connector 171, contacts the received module substrate 149 of the corresponding module 168, along a first line of contacts 150 and a second line of contacts 152. First and second lines of contacts 150 and 152 are offset from one another as a result of the differing lengths of first arm 151 and second arm 153.

The "G-shaped" or hooked structure of first and second plurality of module connectors 124 and 128 and the offset created by first and second arms 151 and 153 of each respective module connector establishes opposing retention forces against the received module substrate 149 of a respective module of plurality of modules 132 when first mounting plate 122 advances into the locked configuration of FIG. 7. In some examples, the described configuration provides effective means of retaining plurality of modules 132 when module stack 120 is in the locked position of FIG. 7, yet still providing a simple way to un-lock module stack 120 to allow for easy replacement of bad or damaged modules of plurality of module 132.

In some examples, either or both first line of contacts 150 or second line of contacts 152 of each module connector, e.g. first module connector 164, may include a plurality of electrical contacts, e.g. electrical spring contacts, that electrically communicate with the plurality of module bond pads 161 of the received module substrate 149. In such examples, first and second plurality of module connectors 124 and 128 facilitate electrical communication between plurality of modules 132 and other components in module stack 120 using one or more of the electrical interconnects of the first and second mounting plates 122 and 126 as described above. For example, as shown in FIG. 7, first module connector 164 establishes electrical connection between module bond pads 161 positioned on the back surface of module substrate 149. The electrical connection is established using a corresponding electrical contact along first line of contacts 150 of first arm 151 that contact the respective module bond pads 161. The electrical signal is transmitted from the respective module bond pads 161, through first arm 151 and through first mounting plate 122 using, for example, a conductive trace 146. Conductive trace 146 may be connected to an external bond pad 148 located on first mounting plate 122 and/or may be used to electrically connect module 168 to another module, e.g., module 170, contained in module stack 120.

In some examples, a respective module substrate 136 of a module from plurality of modules 132 may include a first plurality of module bond pads 138 and a second plurality of module bond pads 140 configured to electrically connect to respective module connectors of first plurality of module connectors 124 and second plurality of module connectors 128. In some examples, first and second plurality of module bond pads 138 and 140 may be positioned on opposite sides of module substrate 136 as shown in FIG. 6. In some such examples, first plurality of module bond pads 138 may be configured to electrically communicate with a first arm 125 of a respective module connector of first plurality of module connectors 124 and second plurality of module bond pads 140 may be configured to electrically communicate with a first arm 133 of a respective module of second plurality of module connectors 128. In some examples, first plurality of module bond pads 138 and a second plurality of module bond pads 140 may be located on the same surface of module substrate 136 (e.g., as shown in FIG. 2A). In some examples, first plurality of module bond pads 138 and a second plurality of module bond pads 140 may be located on different major surfaces of module substrate 136. In some such configurations, each respective plurality of module bond pads, e.g., first plurality of module bond pads 138, may be configured to electrically communicate with both a first arm 125 and second arm 127 of a respective module connector of first plurality of module connectors 124.

Arranging first plurality of module connectors 124 and second plurality of module connectors 128 in the configuration show in FIGS. 6 and 7 may allow for convenient transition between the locked and unlocked configurations, thereby allowing for easy removal and replacement of a module of plurality of modules 132, such as a defective module of plurality of modules 132. Other module connectors 124 and 128 may also be used in module stack 120 that allow removal and replacement of defective modules of plurality of modules 132.

As shown in FIG. 8, once first mounting plate 122 is advanced into the locked configuration, first sidewall 154 may be added to module stack 120. First sidewall 154 includes a first plurality of sidewall fins 156 extending from the major surface of first sidewall 154 (i.e., out of the page of FIG. 8). Each sidewall fin of first plurality of sidewall fins 156 may include a taper similar to the taper discussed above with respect to FIG. 5. Once in position, a major surface 158 of each sidewall fin of first plurality of sidewall fins 154 may contact a corresponding module of plurality of modules 132. For example, major surface 158 of first sidewall fin 160 of first plurality of sidewall fins 154 contacts optional module cover 162 of an adjacent module 170. In some examples, the junction between first sidewall fin 160 and module 170 may include thermal paste 92 to aid the thermal conductivity between module 170 and first sidewall fin 160.

A second sidewall (e.g., second sidewall 98 of FIG. 4A) including a second plurality of sidewall fins, each optionally defining a taper, may also be mounted to module stack 120 to form the assembled circuit package. As the second sidewall advances into position, the corresponding taper of the second plurality of sidewall fins contacts and advances along a respective sidewall fin from first plurality of sidewall fins 156. Once fully assembled, a major surface of each sidewall fin of the second plurality of sidewall fins may also contact a respective module of plurality of modules 132, resulting in an assembled circuit package similar to circuit package 90 shown and described above with respect to FIG. 4A.

Figure 9:
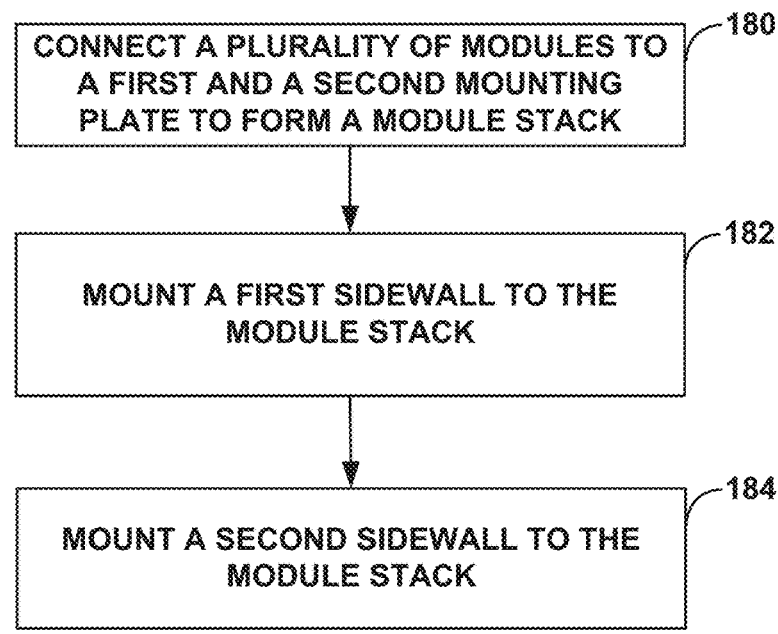
FIG. 9 is a flow diagram illustrating an example technique for forming an example circuit package in accordance with the disclosure.

FIG. 9 is a flow diagram illustrating an example technique for forming an example circuit package in accordance with the disclosure, such as, for example module stack 120 of FIG. 8. While the technique shown in FIG. 9 is described with respect to module stack 120, in other examples, the technique may be used to form other circuit packages that include different configurations.

The technique illustrated in FIG. 9 includes electrically connecting a plurality of modules 132 to respective module connectors 124 attached to first mounting plate 122 and respective module connectors 128 attached to a second mounting plate 126 to form a module stack 120 (180). The plurality of modules 132 may be connected to the respective module connectors 128 and 124 using any of the techniques described above.

The technique of FIG. 8 also includes mounting a first sidewall 154 including a first plurality of sidewall fins 156 to module stack 120 (182). As described above, first plurality of sidewall fins 156 may form at least a partially interleaved pattern with modules 132. At least a portion of the first plurality of sidewall fins 156 may also be coated with a thermal paste 92 to aid in dissipating heat generated by modules 132. In some examples, first sidewall may be removably mounted, as described above, to module stack 120 after the inclusion of modules 132. The removability of first sidewall 154 may make it easier to access and replace damaged or faulty modules 132. In other examples, first sidewall 154 may be fixably mounted to module stack 120. In some such configurations, first and second plurality of module connectors 124 and 128 may be configured to slidably receive modules 132 such that the modules may be conveniently installed in module stack 120 between first plurality of sidewall fins 156.

The technique of FIG. 9 further may include mounting a second sidewall (e.g., sidewall 98 of FIG. 4A) to the module stack 120 on a side of the module stack directly opposite first sidewall 154 (184). In some examples, as described above, second sidewall 98 may include a second plurality of sidewall fins 104 that at least partially interleave with the plurality of modules 132 during assembly.

Various examples have been described. These and other examples are within the scope of the following claims.

What is claimed is:

1. A circuit package comprising:
    a first mounting plate defining a first mounting plate major surface comprising a first plurality of module connectors on the first mounting plate major surface, wherein the first plurality of module connectors comprises a first module connector;
    a second mounting plate defining a second mounting plate major surface comprising a second plurality of module connectors on the second mounting plate major surface, wherein the second plurality of module connectors comprises a second module connector, wherein the first mounting plate major surface is substantially parallel to and facing the second mounting plate major surface, and wherein the first module connector on the first mounting plate and the second module connector on the second mounting plate are configured to receive and form an electrical connection with a first module comprising a plurality of integrated circuits;
    a first sidewall defining a first sidewall major surface and comprising a plurality of sidewall fins extending outward from the first sidewall major surface, wherein the first sidewall is mounted to the first mounting plate and the second mounting plate so that the plurality of sidewall fins are positioned between the first mounting plate major surface and the second mounting plate major surface, and wherein the first module connector and the second module connector are located between a first sidewall fin of the plurality of sidewall fins and a second sidewall fin of the plurality of sidewall fins; and
    a second sidewall defining a second sidewall major surface mounted to the first mounting plate and the second mounting plate so the second sidewall major surface major is substantially parallel to and facing the first sidewall major.

2. The circuit package of claim 1, wherein the at least one sidewall fin of the plurality of sidewall fins includes a mounting aperture configured to receive a mounting rod.

3. The circuit package of claim 1, wherein at least one of the first sidewall or the second sidewall is removeably mounted to the first mounting plate.

4. The circuit package of claim 1, further comprising a lid and a base, wherein the lid and base mount to opposite ends of the first mounting plate, second mounting plate, first sidewall, and second sidewall to hermetically seal the circuit package.

5. The circuit package of claim 1, wherein the plurality of sidewall fins comprises a first plurality of sidewall fins, and wherein the second sidewall comprises a second plurality of sidewall fins extending outward from the second sidewall major surface so that the second plurality of sidewall fins are positioned between the first mounting plate major surface and the second mounting plate major surface.

6. The circuit package of claim 5, wherein at least one sidewall fin of the first plurality of sidewall fins defines a first taper and at least one sidewall fin of the second plurality of sidewall fins defines a second taper, and wherein the first and the second tapers contact one another when the circuit package is assembled.

7. The circuit package of claim 5, wherein at least one sidewall fin of the first plurality of sidewall fins or at least one sidewall fin of the second plurality of fins comprises a thermally conductive material.

8. The circuit package of claim 1, wherein the first module connector of the first plurality of module connectors comprises a first arm defining a first length from first mounting plate major surface and a second arm defining a second length from first mounting plate major surface, wherein the first arm and the second arm are configured to contact opposite sides of a substrate of the received module, wherein at least one of the first arm or the second arm establishes the electrical connection with the received module, and wherein the first length and second length are different.

9. A circuit package comprising:
a first mounting plate defining a first mounting plate major surface comprising a first plurality of module connectors on the first mounting plate major surface;
a second mounting plate defining a second mounting plate major surface comprising a second plurality of module connectors on the second mounting plate major surface, wherein the first mounting plate major surface is substantially parallel to and facing the second mounting plate major surface;
a plurality of modules, wherein each respective module of the plurality of modules comprises a respective module substrate having a first side installed in a respective first module connector of the first plurality of module connectors and a second side installed in a respective second module connector of the second plurality of module connectors;
a first sidewall defining a first sidewall major surface and comprising a plurality of sidewall fins extending outward from the first sidewall major surface, wherein the first sidewall is mounted to the first mounting plate and the second mounting plate so that the plurality of sidewall fins are positioned between the first mounting plate major surface and the second mounting plate major surface, and wherein the plurality of sidewall fins at least partially interleave with the plurality of modules; and
a second sidewall defining a second sidewall major surface mounted to the first mounting plate and the second mounting plate so the second sidewall major surface major is substantially parallel to and facing the first sidewall major.

10. The circuit package of claim 9, wherein each module of the plurality of modules has a surface adjacent to a respective sidewall fin of the plurality of sidewall fins.

11. The circuit package of claim 10, further comprising a thermal paste deposited on the surface of each module of the plurality of modules that provides thermal contact between the respective surface and the respective sidewall fin.

12. The circuit package of claim 9, wherein the respective first module connector of the first plurality of module connectors comprises a first arm defining a first length from first mounting plate major surface and a second arm defining a second length from first mounting plate major surface, wherein the first arm and the second arm are configured to contact opposite surfaces of the respective installed module substrate, wherein at least one of the first arm or the second arm establishes the electrical connection with the respective installed module substrate, and wherein the first length and second length are different.

13. The circuit package of claim 9, wherein the plurality of sidewall fins comprises a first plurality of sidewall fins, and wherein the second sidewall comprises a second plurality of sidewall fins extending outward from the second sidewall major surface so that the second plurality of sidewall fins are positioned between the first mounting plate major surface and the second mounting plate major surface.

14. The circuit package of claim 13, wherein at least one sidewall fin of the first plurality of sidewall fins includes a first mounting aperture and at least one sidewall fin of the second plurality of sidewall fins includes a second mounting aperture, and wherein, when the circuit package is assembled, the first and second mounting apertures substantially align and receive a mounting rod.

15. The circuit package of claim 13, wherein at least one sidewall fin of the first plurality of sidewall fins defines a first taper and at least one sidewall fin of the second plurality of sidewall fins defines a second taper, and wherein the first and the second tapers contact one another when the circuit package is assembled.

16. The circuit package of claim 9, wherein at least one of the first sidewall or the second sidewall is removeably mounted to the first mounting plate.

17. The circuit package of claim 9, further comprising a lid and a base, wherein the lid and base mount to opposite ends of the first mounting plate, second mounting plate, first sidewall, and second sidewall to hermetically seal the circuit package.

18. A method for assembling a circuit package comprising:
electrically connecting a plurality of modules to respective module connectors attached to a first mounting plate major surface of a first mounting plate and respective module connectors attached to a second mounting plate major surface of a second mounting plate to form a module stack, wherein the first mounting plate major surface is substantially parallel to and facing the second mounting plate major surface, and wherein each respective module of the plurality of modules comprises a respective module substrate having a first side installed in a respective first module connector of the module connectors attached to the first mounting plate major surface and a second side installed in a respective second module connector of the module connectors attached to the second mounting plate major surface; and
mounting a first sidewall to the first mounting plate and the second mounting plate of the module stack, wherein the first sidewall defines a first sidewall major surface and comprises a plurality of sidewall fins extending outward from the first sidewall major surface, wherein the first sidewall is mounted such that the plurality of sidewall fins are positioned between the first mounting plate major surface and the second mounting plate major surface and respective sidewall fins of the plurality of sidewall fins at least partially interleave between respective modules of the plurality of modules such that at least one module of the plurality of modules at least partially extends between two adjacent sidewall fins of the plurality of sidewall fins.

19. The method of claim 18, further comprising mounting a second sidewall to the module stack on a side of the module stack directly opposite the first sidewall.

20. The method of claim 19, wherein the second sidewall comprises a second plurality of sidewall fins, and wherein respective second sidewall fins of the second plurality of sidewall fins at least partially interleave with respective modules of the plurality of modules.

* * * * *